United States Patent
Kurosaki

(10) Patent No.: US 9,373,425 B2
(45) Date of Patent: Jun. 21, 2016

(54) COPPER ALLOY SHEET WITH EXCELLENT HEAT DISSIPATION AND WORKABILITY IN REPETITIVE BENDING

(75) Inventor: Ikuya Kurosaki, Kanagawa (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 71 days.

(21) Appl. No.: 14/008,733

(22) PCT Filed: Feb. 28, 2012

(86) PCT No.: PCT/JP2012/054944
§ 371 (c)(1),
(2), (4) Date: Sep. 30, 2013

(87) PCT Pub. No.: WO2012/132713
PCT Pub. Date: Oct. 4, 2012

(65) Prior Publication Data
US 2014/0193655 A1    Jul. 10, 2014

(30) Foreign Application Priority Data

Mar. 30, 2011 (JP) ................................ 2011-076662

(51) Int. Cl.
| | | |
|---|---|---|
| C22C 9/00 | (2006.01) | |
| H01B 1/02 | (2006.01) | |
| C22C 9/02 | (2006.01) | |
| C22C 9/04 | (2006.01) | |
| C22C 9/06 | (2006.01) | |
| C22C 9/10 | (2006.01) | |
| H05K 3/02 | (2006.01) | |
| C22F 1/08 | (2006.01) | |
| H05K 1/02 | (2006.01) | |
| H05K 1/03 | (2006.01) | |

(52) U.S. Cl.
CPC ........ H01B 1/026 (2013.01); C22C 9/00 (2013.01); C22C 9/02 (2013.01); C22C 9/04 (2013.01); C22C 9/06 (2013.01); C22C 9/10 (2013.01); C22F 1/08 (2013.01); H05K 1/02 (2013.01); H05K 3/022 (2013.01); H05K 1/0393 (2013.01); Y10T 428/12 (2015.01)

(58) Field of Classification Search
USPC ............................ 420/469–500; 428/544, 548
See application file for complete search history.

(56) References Cited

U.S. PATENT DOCUMENTS

| 2006/0045790 A1* | 3/2006 | Hatakeyama | ................. 420/473 |
|---|---|---|---|
| 2009/0084473 A1* | 4/2009 | Aruga et al. | .................. 148/554 |
| 2009/0101243 A1 | 4/2009 | Aruga et al. | .................. 148/412 |
| 2010/0304180 A1* | 12/2010 | Amey et al. | .................... 428/626 |

FOREIGN PATENT DOCUMENTS

| EP | 1918390 A1 | 5/2008 | |
|---|---|---|---|
| EP | 2048251 A1 | 4/2009 | |
| JP | 2001-323354 | * 11/2001 | ............... C22F 1/08 |
| JP | 2004256879 A | 9/2004 | |
| JP | 2007005003 A | 1/2007 | |
| JP | 2007141729 A | 6/2007 | |
| JP | 2007177274 A | 7/2007 | |
| JP | 2008075152 A | 4/2008 | |
| JP | 2008106356 A | 5/2008 | |
| JP | 2010090408 A | 4/2010 | |
| TW | 101106921 | 11/2007 | |

OTHER PUBLICATIONS

English machine translation of Kurosawa (JP 2004-256879), JPO, Accessed Feb. 2, 2015.*

* cited by examiner

*Primary Examiner* — Humera Sheikh
*Assistant Examiner* — Lucas Wang
(74) *Attorney, Agent, or Firm* — Drinker Biddle & Reath LLP

(57) ABSTRACT

Provided is a copper alloy plate that is for an FPC substrate and that has superior heat dissipation, repeated bending workability, shape retaining properties, and heat resistance. The copper alloy plate contains at least 0.01 mass % of the total of at least one element selected from the group consisting of Ag, Cr, Fe, In, Ni, P, Si, Sn, Ti, Zn, and Zr, contains no more than 1.0 mass % of Ag, no more than 0.08 mass % of Ti, no more than 2.0 mass % of Ni, no more than 3.5 mass % of Zn, and no more than 0.5 mass % of Cr, Fe, In, P, Si, Sn, and Zr by the total of the at least one element selected from the group, the remainder comprising Cu and impurities, has a conductivity of at least 60% IACS, has a tensile strength of at least 350 MPa, and has $I(311)/IO(311)$ determined by X-ray diffraction in the thickness direction of the plate surface that satisfies the formula $I(311)/IO(311) \geq 0.5$.

6 Claims, No Drawings

COPPER ALLOY SHEET WITH EXCELLENT HEAT DISSIPATION AND WORKABILITY IN REPETITIVE BENDING

TECHNICAL FIELD

The present invention relates to a copper alloy sheet suitable for use in a flexible printed circuit (FPC) board starting with an LED mounting substrate for lighting, particularly to a copper alloy sheet with excellent heat dissipation and workability in repetitive bending, and to electronic components using a copper alloy sheet thereof.

BACKGROUND ART

LED lighting has an advantage such as lower power consumption, a longer service life, and a faster response time as compared to a conventional incandescent lamp and a fluorescent lamp, and its use spreads rapidly with a decline of product prices to broaden its application, in addition to indoor lighting, to various fields such as backlighting of a liquid crystal display (LCD) television and a LCD monitor and automotive lighting.

Since an LED itself is a semiconductor, a light emitting element itself has a long service life when used under specified operating conditions, but a resin material covering a light emitting element is likely to thermally degrade and readily loses clarity with heat generated, leading to make it unsuitable for use. Further, LEDs are also produced in a various forms of packages after taking into account luminescence properties and heat dissipation, but various approaches such as a space saving design and a forming method have to take into account when used in a limited space.

As a response to the problem related to heat generation, lamination of a heat sink plate to FPC has been proposed for improving heat release, while alignment of an LED on an FPC board has been proposed for space saving (Patent Literature 1).

As a lighting device it has been proposed to make complex fabrication of a circuit board mounted with an LED followed by three-dimensional molding (Patent Literature 2).

CITATION LIST

Patent Literature

Patent Literature 1: Japanese Patent Application Laid-Open No. 2007-141729.
Patent Literature 2: Japanese Patent Application Laid-Open No. 2007-5003.

SUMMARY OF INVENTION

Technical Problem

When an LED is mounted on an FPC board, use of an LED for long hours thermally degrades a resin covering the light emitting elements since heat dissipation of a resin used as a substrate is insufficient, resulting in a shorter service life as lighting equipment.

When an aluminum sheet is laminated as a heat sink to an FPC board for measures against heat generation, there is a problem, in which difference between the coefficient of linear thermal expansion of an aluminum sheet and the coefficient of linear thermal expansion of a copper wire constituting a circuitry of an FPC board causes warping of the FPC board. There is further a problem, in which a copper wire experiences tensile stress in repetitive expansion and contraction due to heat, resulting in rupture.

When a copper sheet is used as a heat sink, the above problem does not occur, but copper has a larger strain hardening coefficient than aluminum so that bending portions are likely to create cracks when an FPC board is formed in complex shapes, depending on the forming conditions for rebending and reverse bending. When cracks are created, there is a problem in which cracks propagate, thereby leading to rupture when such an FPC board is used in the environment experiencing repetitive vibration such as in-vehicle applications.

A method of applying three dimensional molding for lighting equipment using a copper sheet as an FPC board is conceivable, but when ordinary tough pitch copper is used in lighting equipment, a copper sheet itself softens by heat generated during its use as lighting equipment, making difficult to maintain its original shape.

That is, the present invention has been made for solving the foregoing problems and has an object to provide a copper alloy sheet for an FPC board with excellent heat dissipation, workability in repetitive bending, shape preservation, and high heat resistance.

Solution to Problem

The present inventors conducted extensive studies to solve the foregoing problems and as a result, found that workability in repetitive bending and the like can be controlled by adjusting the degree of orientation of crystals in a copper alloy sheet.

One aspect of the present invention which was completed using the findings is to provide a copper alloy sheet comprising not less than one kind of elements selected from the group consisting of Ag, Cr, Fe, In, Ni, P, Si, Sn, Ti, Zn, and Zr, amounting to a total of not less than 0.01% by mass, no more than 1.0% by mass of Ag, no more than 0.08% by mass of Ti, no more than 2.0% by mass of Ni, no more than 3.5% by mass of Zn, not less than one type of elements selected from the group of Cr, Fe, In, P, Si, Sn, and Zr, amounting to a total of no more than 0.5% by mass, and the remainder of Cu and impurities, having electrical conductivity of not less than 60% IACS,
having tensile strength of not less than 350 MPa, and
satisfying the relation defined by the following formula of $I(311)/I0(311)$ of an integrated intensity of an X-ray peak determined by X-ray diffraction of the surface of a copper alloy sheet in the thickness direction, $$I(311)/I0(311) \leq 0.5.$$

In an embodiment of a copper alloy sheet related to the present invention, tensile strength is not less than 250 MPa after heated at 200° C. for 30 minutes.

In an embodiment of a copper alloy sheet related to the present invention, a copper alloy sheet for an FPC board is provided.

In other embodiment of a copper alloy sheet related to the present invention, a copper alloy sheet for an FPC board mounted with an LED lighting unit is provided.

In other embodiment of a copper alloy sheet related to the present invention, the thickness of a copper alloy sheet is from 0.05 to 0.3 mm.

In other aspect of the present invention, electronic components using a copper alloy sheet of the present invention is provided.

In further other aspect of the present invention, an FPC board mounted with an LED lighting unit using a copper alloy sheet of the present invention is provided.

Advantageous Effects of Invention

According to the present invention, a copper alloy sheet with excellent heat dissipation, workability in repetitive bending, shape preservation, and high heat resistance is provided for an FPC board.

DESCRIPTION OF EMBODIMENTS

Component of Copper Foil

In the present invention, not less than one type of elements selected from the group consisting of Ag, Cr, Fe, In, Ni, P, Si, Sn, Ti, Zn, and Zr, amounting to a total of not less than 0.01% by mass is added to copper for improving high heat resistance of a copper foil. When a total concentration of elements added is below 0.01% by mass, effects of elements added cannot be expressed, resulting in insufficient high heat resistance. An upper limit of a total concentration of elements added can be described as follows.

Addition of Ag has little effects on reducing electrical conductivity and has no specific limit on the amount added, but cost will be increased with increasing the added concentration so that the amount added is preferably no more than 1.0% by mass.

The total amount of Cr, Fe, In, P, Sn, Zr, and Si added, which have large effects on reducing electrical conductivity is preferably no more than 0.5% by mass, and the amount of Ti which has particularly large effects on reducing electrical conductivity is preferably no more than 0.08% by mass.

The amount of Ni and Zn added is preferably no more than 2.0% by mass and 3.5% by mass, respectively.

Oxygen free copper defined by JIS-1020 or tough pitch copper defined by JIS-1100 is suitable as a base material for copper to which alloying elements are added. The oxygen concentration is generally kept to from 0.01 to 0.05% by mass in the molten metal of tough pitch copper and to 0.001% by mass in the molten metal of oxygen free copper, respectively.

Cr, Fe, In, Ni, P, Si, Sn, Ti, Zn, and Zr, which are more susceptible to oxidation as compared to Cu are generally added to the molten metal of oxygen free copper. An oxygen scavenger such as P and Si may be added to the molten copper containing oxygen to reduce the oxygen concentration to no more than 10 ppm, followed by addition of such alloying elements. Since Ag is less susceptible to oxidation than Cu, Ag can be added to both molten metals of tough pitch copper and oxygen free copper.

Heat Dissipation

A material with good thermal conductivity is required for releasing heat from a heated material. A material with higher electrical conductivity is preferred for conducting heat. When taking into account heat generation in lighting of an LED unit, there is a factor affecting heat generation such as component density of an LED mounted and a shape of lighting equipment, but electrical conductivity of not less than 60% IACS is good enough, and electrical conductivity of not less than 70% IACS is more preferred.

Workability in Repetitive Bending

When a correlation between workability in repetitive bending and texture of crystals in a copper alloy sheet was studied, it was found that a ratio of the integrated intensity of a (311) peak, I(311), of the surface of a copper alloy sheet in the thickness direction determined by X-ray diffraction to the integrated intensity of a (311) peak, I0(311), of copper fine powders determined by X-ray diffraction, I(311)/I0(311), is correlated with workability in repetitive bending, while its reason is not clear, and workability in repetitive bending is good when the following relation is satisfied:

$$I(311)/I0(311) \geq 0.5.$$

Further, I(311)/I0(311) is also preferably not less than 0.8, more preferably not less than 1.0.

Shape Preservation Properties

A material needs certain strength for preserving the original shape of a formed product after forming a material into a desired shape. There is a factor affecting shape preservation such as the shape structure of a formed product, but tensile strength indicative of material strength has to be not less than 350 MPa since the shape of a formed part is easily deformed by applying force when tensile strength is below 350 MPa. An upper limit of tensile strength is not particularly set, but it is known that bending workability is getting worse when its strength is increased by increasing the reduction ratio of the material, so that balance with bending workability has to take into account when fabricating the material. Tensile strength is more preferably not less than 400 MPa.

High Heat Resistance

On high heat resistance, an LED lighting unit is designed for use generally below 150° C. for long hours as lighting equipment after taking into account the characteristics of LED lighting. Ordinary tough pitch copper cannot be prevented from softening after the long term use even if the temperature is kept below 150° C., and the original shape after forming cannot be preserved when the copper is once softened. It is important to assure certain high heat resistance for preventing such phenomena. In one hand, lighting equipment is assumed to be used for several tens of thousands of hours, but a long term heating test for reproducing this situation without modification is not practical so that it was concluded that as a guide, a material has good high heat resistance when tensile strength of not less than 250 MPa is kept after heated at higher temperature but for a shorter period of time, that is, herein at 200° C. for 30 minutes. It is also more preferred that tensile strength of not less than 300 MPa is kept after a material is heated at 200° C. for 30 minutes.

The thickness of a copper alloy sheet related to the present invention is preferably from 0.05 to 0.3 mm. When the thickness of a material is below 0.05 mm, there may be a problem, in which preservation of a shape is difficult since the material is too thin, whereas when the thickness is above 0.3 mm, there may be a problem, in which the weight of a product becomes too heavy since the material is too thick. A copper alloy sheet related to the present invention may also include the form of a copper foil.

When the X-ray diffraction intensity of a copper alloy sheet is within the range of the characteristics, effects of the present invention can be expressed regardless of compositions and production conditions. A copper alloy sheet of the present invention can be produced, for example, by a process as follows.

A process for producing a rolled copper foil uses electrolytic copper as a raw material of pure copper, to which alloying elements are added as needed, followed by casting to produce an ingot with the thickness of from 100 to 300 mm. The ingot is hot-rolled to the thickness in a range of from 5 to 20 mm, followed by repeating a cycle of cold rolling and annealing alternately, and finally carrying out cold rolling to produce a foil with the desired thickness.

A copper alloy sheet satisfying the relation defined by the formula for the ratio of the X-ray diffraction peak intensity for workability in repetitive bending and the defined range of tensile strength can be obtained by adjusting the rate of temperature elevation in a final recrystallization annealing step, the total reduction ratio used as working conditions for a final cold rolling step performed immediately after a final recrystallization annealing step, and the reduction ratio at first pass. The final recrystallization annealing step herein is a recrystallization annealing step before a final cold rolling step for adjusting the thickness of a final product. In a final cold rolling step, a material is repetitively passed between a pair of rolls (referred to hereinafter as "pass") for adjusting the thickness of a final product. First pass herein indicates initial pass in a series of passes of the final cold rolling step for working a material to adjust the thickness of a final product after a final recrystallization annealing step.

The rate of temperature elevation in a final recrystallization annealing step may be from 12 to 50° C./sec. When the rate is below 12° C./min or above 50° C./min, it is difficult to satisfy the workability in repetitive bending described above.

The total reduction ratio in a final cold rolling step may be no more than 85%. The reduction ratio herein is given by the percentage of a value, of which the difference of the sheet thickness before and after a cold rolling step is divided by the thickness of the sheet before a cold rolling step. When the total reduction ratio in a final cold rolling step exceeds 85%, it is difficult to satisfy the workability in repetitive bending described above. A lower limit of the total reduction ratio depends on compositions of alloys and the concentration of alloying elements, and the total reduction ratio may be selected such that tensile strength of a copper alloy sheet exceeds the lower limit thereof.

The reduction ratio of a copper alloy sheet at first pass of a final cold rolling step may be no more than 20%. When the reduction ratio of a copper alloy sheet exceeds 20%, the relation in the X-ray diffraction intensity thereof cannot follow the defined formula, thereby making difficult to satisfy workability in repetitive bending described above.

A copper alloy sheet of the present invention can be used in electronic components such as lead frames, connectors, pins, terminals, relays, switches, and a foil material for a secondary battery. Also a copper alloy sheet is particularly suitable as a material for an FPC board mounted with an LED lighting unit.

EXAMPLES

Hereinafter, examples of the present invention will be described, but the examples are provided for better understating of the present invention and benefits thereof, but in no way to intend limiting the invention.

Production of Rolled Copper Foil

Various elements were added to oxygen free copper, which was casted to an ingot with the thickness of 100 mm. The ingot was next rolled using hot rolling to the thickness of 5 mm, from which oxide scale was removed, followed by repeating a cycle of cold rolling and annealing steps and then rolled in a final cold rolling step under the conditions according to Tables 1 and 2 to the thickness of from 0.05 to 0.3 mm. A final recrystallization annealing step was performed immediately before a final cold rolling step. A final recrystallization annealing step was performed at the rate of temperature elevation according to Tables 1 and 2 to heat the material to 500° C. at maximum, and the rate of temperature elevation was calculated using the time required for raising the temperature of material from ambient temperature (25° C.) to 500° C. And as soon as the temperature of the material reached 500° C., the material was cooled.

Shape Preservation Properties

A test piece of JIS 13B was sampled as a test specimen according to JIS Z-2241 such that the direction parallel to rolling is the longitudinal direction of the test piece for determining tensile strength by a tensile test. In a tensile test, a tensile testing machine UTM-10T made of ORIENTEC Co., Ltd. was used to determine tensile strength of the test piece at a cross-head speed of 5 mm/min twice (n=2), which was averaged as a measured value. When tensile strength was not less than 350 MPa, it was concluded that shape preservation properties were good (indicated by ○), whereas when tensile strength was below 350 MPa, it was concluded that shape preservation properties were poor (indicated by ×).

Heat Dissipation

Heat dissipation of a copper alloy sheet with the thickness of the sheet after a final cold rolling step was evaluated by measuring electrical conductivity (% IACS) with a four-point probe method according to JIS H-0505.

Degree of Texture in Crystals

An integrated intensity of a (311) diffraction peak, I(311) of the surface of a copper alloy sheet in the thickness direction in X-ray diffraction and an integrated intensity of a (311) diffraction peak I0(311) of copper fine powders in an X-ray diffraction were determined using a RINT-TTR X-ray diffractometer made of Rigaku Co., Ltd. Next, the ratio of I(311)/I0(311) was calculated.

High Heat Resistance

The test piece of JIS 13B was used to place in a heating furnace to raise the temperature to 200° C., at which the test piece was kept for 30 minutes and taken out to cool with air and used for a tensile test. A tensile test was performed under similar conditions to the above test for determining shape preservation properties. When tensile strength is not less than 250 MPa, it was concluded that high heat resistance was good (indicated by ○), whereas when tensile strength was below 250 MPa, it was concluded that high heat resistance was poor (indicated by ×). Tables 1 and 2 show the evaluation conditions and results thereof.

Workability in Repetitive Bending

A following procedure was used to evaluate workability in repetitive bending.

(1) Test pieces with a dimension of 50 mm in length and 10 mm in width were sampled such that test pieces have the directions parallel and perpendicular to rolling.

(2) The test piece was bent at bending radius of 0.5 mm (R=0.5 mm) to 90 degrees by V-shape bending and subjected to reverse bending to return to the original rectangular shape, followed by repeating a cycle of 90 degrees V-shape bending and reverse bending.

(3) This operation was repeated and an image of the bend portion of the V-shape bend piece was enlarged 50 times in every cycle of bending and reverse bending for observing whether or not there is generation of cracks or rupture. And the maximum bending frequency before generating cracks or rupture was studied. It was concluded that workability in repetitive bending was excellent with indication of ⊙ for the maximum bending frequency of 5 or more when cracks are not generated, good with indication of ○ for the maximum bending frequency of 4, fair with indication of Δ for the maximum bending frequency of 3, and poor with indication of × for the maximum bending frequency below 3.

TABLE 1

| | | Sheet thickness (mm) | Element added (% by mass) | Rate of temperature elevation in final recrystallization annealing (° C./sec) | Final cold rolling Total reduction ratio (%) | Final cold rolling Reduction ratio at first pass (%) | Tensile strength (MPa) | Shape preservation properties | Electrical conductivity (% IACS) | Degree of texture of (311) (I/I0) | High heat resistance (heating at 200° C. for 30 minutes) | Workability in repetitive bending |
|---|---|---|---|---|---|---|---|---|---|---|---|---|
| Example | 1 | 0.07 | 0.12% Sn | 14 | 75 | 20 | 445 | ○ | 88 | 1.2 | ○ | ⊙ |
| | 2 | 0.07 | 0.12% Sn | 27 | 75 | 20 | 442 | ○ | 88 | 1.0 | ○ | ⊙ |
| | 3 | 0.07 | 0.12% Sn | 48 | 75 | 20 | 446 | ○ | 88 | 0.7 | ○ | Δ |
| | 4 | 0.07 | 0.12% Sn | 35 | 75 | 20 | 440 | ○ | 88 | 1.0 | ○ | ⊙ |
| | 5 | 0.07 | 0.12% Sn | 27 | 75 | 10 | 447 | ○ | 88 | 1.2 | ○ | ⊙ |
| | 6 | 0.07 | 0.12% Sn | 26 | 80 | 10 | 458 | ○ | 88 | 1.2 | ○ | ⊙ |
| | 7 | 0.07 | 0.12% Sn | 27 | 60 | 10 | 423 | ○ | 88 | 1.6 | ○ | ⊙ |
| | 8 | 0.07 | 0.10% Sn | 27 | 75 | 15 | 440 | ○ | 90 | 1.1 | ○ | ⊙ |
| | 9 | 0.07 | 0.10% Zr | 25 | 75 | 15 | 513 | ○ | 90 | 0.7 | ○ | Δ |
| | 10 | 0.07 | 0.020% Zr | 27 | 75 | 15 | 473 | ○ | 97 | 1.2 | ○ | ⊙ |
| | 11 | 0.07 | 0.080% Ti | 27 | 75 | 15 | 513 | ○ | 62 | 0.8 | ○ | ○ |
| | 12 | 0.07 | 0.020% Ti | 25 | 75 | 15 | 482 | ○ | 84 | 1.3 | ○ | ⊙ |
| | 13 | 0.07 | 1.0% Ag | 28 | 75 | 15 | 458 | ○ | 92 | 1.0 | ○ | ⊙ |
| | 14 | 0.07 | 0.10% Ag | 27 | 75 | 15 | 445 | ○ | 99 | 1.0 | ○ | ⊙ |
| | 15 | 0.07 | 0.15% Cr | 27 | 75 | 15 | 465 | ○ | 89 | 0.9 | ○ | ○ |
| | 16 | 0.07 | 0.10% Cr | 27 | 75 | 15 | 461 | ○ | 91 | 1.1 | ○ | ⊙ |
| | 17 | 0.07 | 0.15% Fe, 0.025% P | 25 | 75 | 15 | 497 | ○ | 88 | 1.0 | ○ | ⊙ |
| | 18 | 0.07 | 0.08% Fe, 0.030% P | 26 | 75 | 15 | 475 | ○ | 92 | 1.1 | ○ | ⊙ |
| | 19 | 0.15 | 0.12% Sn | 33 | 70 | 20 | 406 | ○ | 88 | 1.2 | ○ | ⊙ |
| | 20 | 0.15 | 0.12% Sn | 26 | 70 | 20 | 401 | ○ | 88 | 0.9 | ○ | ⊙ |
| | 21 | 0.15 | 0.020% Zr | 33 | 50 | 20 | 417 | ○ | 97 | 1.2 | ○ | ⊙ |
| | 22 | 0.1075 | 0.020% Ti | 35 | 50 | 20 | 443 | ○ | 84 | 1.2 | ○ | ⊙ |
| | 23 | 0.15 | 0.15% Fe, 0.025% P | 34 | 50 | 20 | 430 | ○ | 88 | 1.2 | ○ | ⊙ |
| | 24 | 0.20 | 0.12% Sn | 36 | 50 | 20 | 389 | ○ | 88 | 1.6 | ○ | ⊙ |
| | 25 | 0.20 | 0.15% Cr | 36 | 50 | 20 | 402 | ○ | 89 | 1.3 | ○ | ⊙ |
| | 26 | 0.15 | 1.8% Ni, 0.40% Si | 34 | 50 | 20 | 535 | ○ | 61 | 1.0 | ○ | ⊙ |
| | 27 | 0.15 | 3.4% Zn | 35 | 50 | 20 | 474 | | | | | |
| | 28 | 0.15 | 0.10% In, 0.40% Si | 34 | 50 | 20 | 436 | | | | | |
| | 29 | 0.07 | 0.012% Sn | 27 | 60 | 10 | 395 | | | | | |
| | 30 | 0.07 | 0.010% Ag | 27 | 75 | 15 | 401 | | | | | |
| | 31 | 0.07 | 0.017% Ag | 27 | 75 | 15 | 415 | | | | | |
| | 32 | 0.05 | 0.12% Sn | 30 | 80 | 10 | 457 | | | | | |
| | 33 | 0.30 | 0.12% Sn | 16 | 50 | 10 | 387 | | | | | |

TABLE 1-continued

| | | | | | |
|---|---|---|---|---|---|
| 27 | ○ | 63 | 1.1 | ○ | ⊙ |
| 28 | ○ | 64 | 1.0 | ○ | ⊙ |
| 29 | ○ | 95 | 1.8 | ○ | ⊙ |
| 30 | ○ | 99 | 1.3 | ○ | ⊙ |
| 31 | ○ | 99 | 1.2 | ○ | ⊙ |
| 32 | ○ | 88 | 1.1 | ○ | ⊙ |
| 33 | ○ | 88 | 1.9 | ○ | ⊙ |

TABLE 2

| | | Sheet thickness (mm) | Element added (% by mass) | Rate of temperature elevation in final recrystallization annealing (° C./sec) | Final cold rolling | | Tensile strength (MPa) |
|---|---|---|---|---|---|---|---|
| | | | | | Total reduction ratio (%) | Reduction ratio at first pass (%) | |
| Comparative Example | 1 | 0.07 | — | 27 | 75 | 20 | 418 |
| | 2 | 0.07 | 0.008% Sn | 27 | 75 | 20 | 432 |
| | 3 | 0.07 | 0.12% Sn | 25 | 90 | 20 | 482 |
| | 4 | 0.07 | 0.10% Ti | 27 | 75 | 15 | 563 |
| | 5 | 0.07 | 0.10% Zr | 26 | 75 | 30 | 522 |
| | 6 | 0.15 | 0.12% Sn | 10 | 70 | 15 | 411 |
| | 7 | 0.15 | 0.12% Sn | 54 | 75 | 15 | 446 |
| | 8 | 0.15 | 0.12% Sn | 26 | 40 | 15 | 343 |
| | 9 | 0.15 | 0.12% Sn | 26 | 75 | 45 | 447 |

| | | Shape reservation properties | Electrical conductivity (% IACS) | Degree of texture of (311) (I/I0) | High heat resistance (heating at 200° C. for 30 minutes) | Workability in repetitive bending |
|---|---|---|---|---|---|---|
| Comparative Example | 1 | ○ | 99 | 1.2 | X | ⊙ |
| | 2 | ⊙ | 97 | 1.0 | X | ⊙ |
| | 3 | ○ | 88 | 0.3 | ○ | X |
| | 4 | ○ | 50 | 1.1 | ○ | ⊙ |
| | 5 | ○ | 90 | 0.3 | ○ | X |
| | 6 | ○ | 88 | 0.3 | ○ | X |
| | 7 | ○ | 88 | 0.4 | ○ | X |
| | 8 | X | 88 | 1.3 | ○ | ⊙ |
| | 9 | ○ | 90 | 0.4 | ○ | X |

All copper alloy sheets in Examples 1 to 33 are excellent in heat dissipation (electrical conductivity), workability in repetitive bending, shape preservation properties, and high heat resistance since the total concentration of alloying elements added is not less than 0.01% by mass and the concentration of each element added was no more than the upper limit thereof in all copper alloy sheets and have tensile strength of not less than 350 MPa, and tensile strength of not less than 250 MPa after heated at 200° C. for 30 minutes, and the relation of I(311)/I0(311)≤0.5 in the X-ray diffraction intensity was held in all copper alloy sheets.

In Comparative Example 1, pure copper without any elements added was used and poor in high heat resistance.

In Comparative Example 2, Sn was added but the concentration thereof was below 0.01% by mass, resulting in poor high heat resistance.

In Comparative Example 3, a copper alloy sheet exceeded the total reduction ratio of 85% in a final cold rolling step and did not satisfy the relation defined by the formula of the X-ray diffraction intensity, resulting in poor workability in repetitive bending.

In Comparative Example 4, the copper alloy sheet had low electrical conductivity and poor heat dissipation since the concentration of elements added was too high.

In Comparative Examples 5 and 9, the relation defined by the formula for the X-ray diffraction intensity was not satisfied, resulting in poor workability in repetitive bending, since while the total rolling reduction ratio in a final cold rolling step was no more than 85%, the reduction ratio at first pass of a final cold rolling step exceeded 20%.

In Comparative Example 6, the relation defined by the formula for the X-ray diffraction intensity was not satisfied, resulting in poor workability in repetitive bending, since while the total rolling reduction ratio in a final cold rolling step was no more than 85%, the rate of temperature elevation in a final recrystallization annealing step was below 12° C./sec.

In Comparative Example 7, the relation defined by the formula for the X-ray diffraction intensity was not satisfied, resulting in poor workability in repetitive bending, since while the total rolling reduction ratio in a final cold rolling step was no more than 85%, the rate of temperature elevation in a final recrystallization annealing step exceeded 50° C./sec.

In Comparative Example 8, tensile strength of a copper alloy sheet was below 350 MPa, resulting in poor shape preservation, since the total reduction ratio in a final recrystallization annealing step was too low.

What is claimed is:

1. A copper alloy sheet comprising not less than one type of element selected from the group consisting of Ag, Cr, Fe, In, Ni, P, Si, Sn, Ti, Zn, and Zr, amounting to a total of not less than 0.01% by mass, no more than 1.0% by mass of Ag, no more than of 0.08% by mass of Ti, no more than 2.0% by mass of Ni, no more than 3.5% by mass of Zn, not less than one type of element selected from the group of Cr, Fe, In, P, Si, Sn, and Zr, amounting to a total of no more than of 0.5% by mass, and the remainder of Cu and impurities, said copper alloy sheet having an electrical conductivity of not less than 60% IACS, having a tensile strength of not less than 350 MPa, and satisfying the relation defined by the following formula of $I(311)/I_0(311)$ in an X-ray diffraction intensity determined by X-ray diffraction of the surface of a sheet in the thickness direction:

$I(311)/I_0(311) \geq 1.1$.

2. The copper alloy sheet according to claim 1, wherein tensile strength is not less than 250 MPa after heating at 200° C. for 30 minutes.

3. The copper alloy sheet according to claim 1 or 2, wherein the thickness of the copper alloy sheet is from 0.05 to 0.3 mm.

4. An electronic component comprising the copper alloy sheet according to claim 1 or 2.

5. A flexible printed circuit board comprising the copper alloy sheet according to claim 1 or 2.

6. An electronic component comprising the copper alloy sheet according to claim 3.

* * * * *